(12) United States Patent
Maruyama et al.

(10) Patent No.: US 10,347,816 B2
(45) Date of Patent: Jul. 9, 2019

(54) PIEZOELECTRIC DRIVING DEVICE

(71) Applicant: TDK CORPORATION, Tokyo (JP)

(72) Inventors: Toshiki Maruyama, Tokyo (JP); Takuto Horii, Tokyo (JP); Ryuichi Sakai, Tokyo (JP); Shunsuke Ueno, Tokyo (JP); Atsushi Ezawa, Tokyo (JP); Tatsuya Taki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 376 days.

(21) Appl. No.: 15/420,798

(22) Filed: Jan. 31, 2017

(65) Prior Publication Data

US 2017/0229636 A1      Aug. 10, 2017

(30) Foreign Application Priority Data

Feb. 5, 2016   (JP) .................................. 2016-021059
Feb. 5, 2016   (JP) .................................. 2016-021064

(51) Int. Cl.
 *H01L 41/083*    (2006.01)
 *H01L 41/09*     (2006.01)
 *H01L 41/04*     (2006.01)
 *H01L 41/047*    (2006.01)

(52) U.S. Cl.
 CPC ............ *H01L 41/09* (2013.01); *H01L 41/042* (2013.01); *H01L 41/0471* (2013.01); *H01L 41/0472* (2013.01); *H01L 41/083* (2013.01)

(58) Field of Classification Search
 CPC ............... H01L 41/042; H01L 41/0471; H01L 41/0472; H01L 41/083
 See application file for complete search history.

(56) References Cited

U.S. PATENT DOCUMENTS

| 2005/0236934 | A1  | 10/2005 | Koganezawa et al. |
| 2007/0228884 | A1* | 10/2007 | Manabe ................. G02B 7/102 |
|              |     |         | 310/328 |
| 2012/0187800 | A1  | 7/2012  | Yoda et al. |
| 2014/0355647 | A1  | 12/2014 | Lee et al. |

FOREIGN PATENT DOCUMENTS

| CN | 104218144 A    | 12/2014 |
| JP | 2005-312200 A  | 11/2005 |
| JP | 2005-312230 A  | 11/2005 |
| JP | 2006-141171 A  | 6/2006 |
| JP | 2007-181384 A  | 7/2007 |
| JP | 2007-274777 A  | 10/2007 |
| JP | 2014-060885 A  | 4/2014 |
| WO | 2011/049022 A1 | 4/2011 |

* cited by examiner

*Primary Examiner* — J. San Martin
(74) *Attorney, Agent, or Firm* — Oliff PLC

(57) ABSTRACT

The present invention relates to a piezoelectric driving device 10 capable of moving the movable member 14 along the axis direction engaged in a movable manner to the axial direction with respect to the shaft 16. A pair of the external electrodes 26 and 27 respectively comprises the first external connection part 26a and the second external connection part 27a formed at the lower end face in Z axis direction by being insulated against each other. At the opposing face of the weight member 30 facing against the lower end face of the element 20, the first circuit pattern 36 and the second circuit pattern 37 are formed by being insulated against each other; and the first circuit pattern 36 and the second circuit pattern 37 are respectively connected to the first external connection part 26 and the second external connection part 27 by a metal bonding.

10 Claims, 4 Drawing Sheets

PIEZOELECTRIC DRIVING DEVICE

BACKGROUND OF THE INVENTION

1. Field of the Invention

The present invention relates to a piezoelectric driving device for moving a movable body such as a lens frame or so engaged to a shaft by vibrating a multilayered piezoelectric element.

2. Description of the Related Art

As a piezoelectric driving device for driving a lens frame in an axial direction using a multilayered piezoelectric element, for example a piezoelectric driving device shown in JP Patent Application Laid Open No. 2007-274777 is known. In the piezoelectric driving device shown in this application, a connecting terminal is fitted to a non-extendible part of the piezoelectric element, and the wire member is connected to the connecting terminal, thereby the electric power is supplied to the piezoelectric element.

In the invention shown in this application, the non-extendible part of the piezoelectric element functions as the weight part. However, in order for the non-extendible part of the piezoelectric element to function as the weight part, the non-extendible part has to become relatively larger along with the piezoelectric element becoming smaller, thus it contradicts with the demand for making the piezoelectric element more compact.

Hence, besides the piezoelectric element, it is necessary to connect the weight member having heavier specific gravity than the piezoelectric element. In such case, conventionally, the process for connecting the wire member to the connecting terminal of the piezoelectric element, and the process for connecting the piezoelectric element and the weight member are necessary. Along with the demand of making the piezoelectric element more compact, it is also demanded to automate such processes.

SUMMARY OF THE INVENTION

The present invention is attained in view of such circumstances, and its object is to provide a piezoelectric driving device capable of making the piezoelectric element more compact, and attaining easy wiring and connection between the piezoelectric element and the weight member, having excellent mechanical strength, and with little loss of the displacement of the piezoelectric element.

In order to achieve the above object, the piezoelectric driving device according to the first aspect of the present invention comprises a multilayered piezoelectric element comprising internal electrodes stacked by placing a piezoelectric layer in between, and a pair of external electrodes electrically connected to said internal electrodes, a weight member fitted to one of a first end face in said stacking direction of said multilayered piezoelectric element, a shaft fitted to other second end face in said stacking direction of said multilayered piezoelectric element, and a movable member engaged against said shaft in a movable manner in an axial direction which moves by driving said multilayered piezoelectric element, wherein a pair of said external electrodes comprises a first external connection part and a second external connection part which are respectively formed at said first end face and so that said first external connection part and said second external connection part are insulated against each other, a first circuit pattern and a second circuit pattern which are insulated against each other are formed at an opposing face of said weight member facing said first end face, and said first circuit pattern and said second circuit pattern are respectively connected to said first external connection part and said second external connection part by metal bonding.

In the piezoelectric driving device according to the first aspect of the present invention, the multilayered piezoelectric element is not connected with a lead wire or a metal terminal via solder. The electric power supply to the multilayered piezoelectric element of the present invention is carried out by a metal bonding between the first circuit pattern of the weight member and the first external connection part of the multilayered piezoelectric driving device, and also carried out by a metal boding between the second circuit pattern of the weight member and the second external connection part of the multilayered piezoelectric element.

Thereby, a strong connection between the multilayered piezoelectric element and the weight member, and the wiring for the electrical connection to the multilayered piezoelectric element can be ensured at the same time. Therefore, even in case of making the multilayered piezoelectric element compact, the multilayered piezoelectric element and the weight member can be connected easily, and the wiring for the electrical power supply to the multilayered piezoelectric element can be done easily. Also, these can be easily automated.

Further, the wiring is attained by connecting the multilayered piezoelectric element and the weight member, and is not connected with the wire member such as the lead wire or the metal terminal or so apart from the weight, thus a sudden force does not act on the wire member, and the wire is not disconnected at the connection part between the wire member.

Further, because the multilayered piezoelectric element and the weight member are connected by a metal bonding, the bonding strength therebetween is enhanced. Also, compared to the case of connecting the multilayered piezoelectric element and the weight member by the adhesive agent, there is no absorption of the displacement at the adhesive agent part, and the displacement force of the multilayered piezoelectric element is directly transmitted to the weight, hence the driving force improves (lesser loss of the displacement).

Preferably, said weight member is constituted by a metal, the insulation layer is formed at the surface of said weight member, and the first circuit pattern and the second circuit pattern are formed at the surface of said insulation layer. By constituting the weight member by a metal, the density of the weight member increases, and will contribute to make the piezoelectric driving device compact. Note that in case of constituting the weight member by a metal, the insulation becomes an issue, however by coating the surface of the weight member by the insulation layer, the circuit patterns are insulated against each other.

Preferably, at said second end face, the dummy electrode is formed which is insulated against said external electrode, and the metal face of said shaft facing said dummy electrode is connected with said dummy electrode by a metal bonding, and the shaft and the multilayered piezoelectric element are connected. By constituting as such, the connection between the multilayered piezoelectric element and the shaft becomes stronger, and the connection process of these can be automated.

Preferably, said first circuit pattern and said second circuit pattern are not only formed at the opposing face of said weight member, but also continuously formed to the fitting face to the surface of the frame where said weight member is fitted.

At the surface of said frame, the frame side circuit pattern where said first circuit pattern and second circuit pattern are connected is formed.

By constituting as such, the weight member can be connected with the frame, and at the same time the circuit pattern formed on the frame and the circuit pattern formed on the weight member can be electrically connected. These connections can be also carried out by a metal bonding.

In order to achieve such object, the piezoelectric driving device according to the second aspect of the present invention comprises a multilayered piezoelectric element comprising internal electrodes stacked by placing a piezoelectric layer in between, and a pair of first external electrode and second external electrode electrically connected to said internal electrodes, a weight member fitted to one of a first end face in said stacking direction of said multilayered piezoelectric element, a shaft fitted to other second end face in said stacking direction of said multilayered piezoelectric element, and a movable member engaged against said shaft in a movable manner in an axial direction which moves by driving said multilayered piezoelectric element, wherein said first external electrode comprises a first external connection part formed at said first end face, said second external electrode comprises a second external connection part formed at said second end face, a weight side metal face is formed at an opposing face of said weight member which is facing said first end face, and said weight side metal face is connected to said first external connection part by metal bonding, a shaft side metal face is formed at an opposing face of said shaft which is facing said second end face, and said shaft side metal face is connected to said second external connection part by a metal bonding.

In the piezoelectric driving device according to the second aspect of the present invention, the multilayered piezoelectric element is not connected with the lead wire or the metal terminal via solder. The electrical power supply to the multilayered piezoelectric element is carried out by a metal bonding between the weight side metal face of the weight member and the first external connection part of the multilayered piezoelectric element, and a metal bonding between the shaft side metal face of the shaft and the second external connection part of the multilayered piezoelectric element. These parts formed with the metal bonding are the part where the reverse-polarity voltage is applied for driving the multilayered piezoelectric element, and at the same time it also functions as the connection between the multilayered piezoelectric element and the weight member, and also as the connection between the multilayered piezoelectric element and the shaft.

Therefore, a strong connection between the multilayered piezoelectric element and the weight member, a strong connection between the multilayered piezoelectric element and the shaft, and the electrical connection wiring to the multilayered piezoelectric element can be secured all at the same time. Therefore, even if the multilayered piezoelectric element is made compact, the multilayered piezoelectric element and the weight member can be easily connected, the multilayered piezoelectric element and the shaft can be easily connected, and the wiring for supplying the electrical power to the multilayered piezoelectric element can be done easily.

Further, to the multilayered piezoelectric element, the wire members such as the lead wire or the metal terminal are not connected apart from the weight and the shaft, thus a sudden force does not act on the wire member, and the disconnection at the connection part of the wire member does not occur. Also, at least part of the shaft (or it may be the entire shaft) and at least part of the weight member (or it may be the entire weight member) function as the wire, thus the number of the parts can be reduced as well.

Furthermore, the multilayered piezoelectric element and the weight member are connected by a metal bonding, and also the multilayered piezoelectric element and the shaft are connected by a metal bonding, thus the bonding strength thereof can be enhanced. Also, compared to the case of connecting the multilayered piezoelectric element and the shaft, or connecting the multilayered piezoelectric element and the shaft by the adhesive agent, the displacement is not absorbed at the adhesive agent part, and the displacement force of the multilayered piezoelectric element is transmitted directly to the weight and the shaft, hence the driving force is improved (lesser loss of the displacement).

Preferably, said weight member is constituted by a metal. By constituting the weight member by a metal, the density of the weight member increases, and will contribute to make the piezoelectric driving device compact. Also, by constituting the weight member by a metal, the outer surface of the weight member will constitute the weight side metal face itself; hence there is no need to form the metal face apart from the weight member. Note that, when the weight member is constituted by material other than metal, the weight side metal face which connects the multilayered piezoelectric element by a metal bonding may be formed by the circuit pattern such as a metal film or so.

Preferably, at said shaft, a shaft pressor is contacting thereto, and an electric power can be supplied to said shaft side metal face via said shaft and said shaft pressor. For example, in the lens driving device, the shaft pressor is an essential part, and it allows providing the electric power to the multilayered piezoelectric element via the shaft side metal face without increasing the number of the parts.

In case said shaft is a metal, the shaft side metal face can be easily formed using the outer surface of the shaft itself. In such case, the shaft itself will be the electrical conductive pathways. In case the shaft is a conductive material other than a metal, the same applies. Note that, in order to form the metal face, the circuit pattern may be formed by a metal film at the predetermined position of the shaft. The same applies in case the shaft is the insulator.

BRIEF DESCRIPTION OF DRAWINGS

Hereinafter, the present invention will be described based on the embodiment shown in the figure.

DESCRIPTION OF THE PREFERRED EMBODIMENTS

First Embodiment

Figure 1:
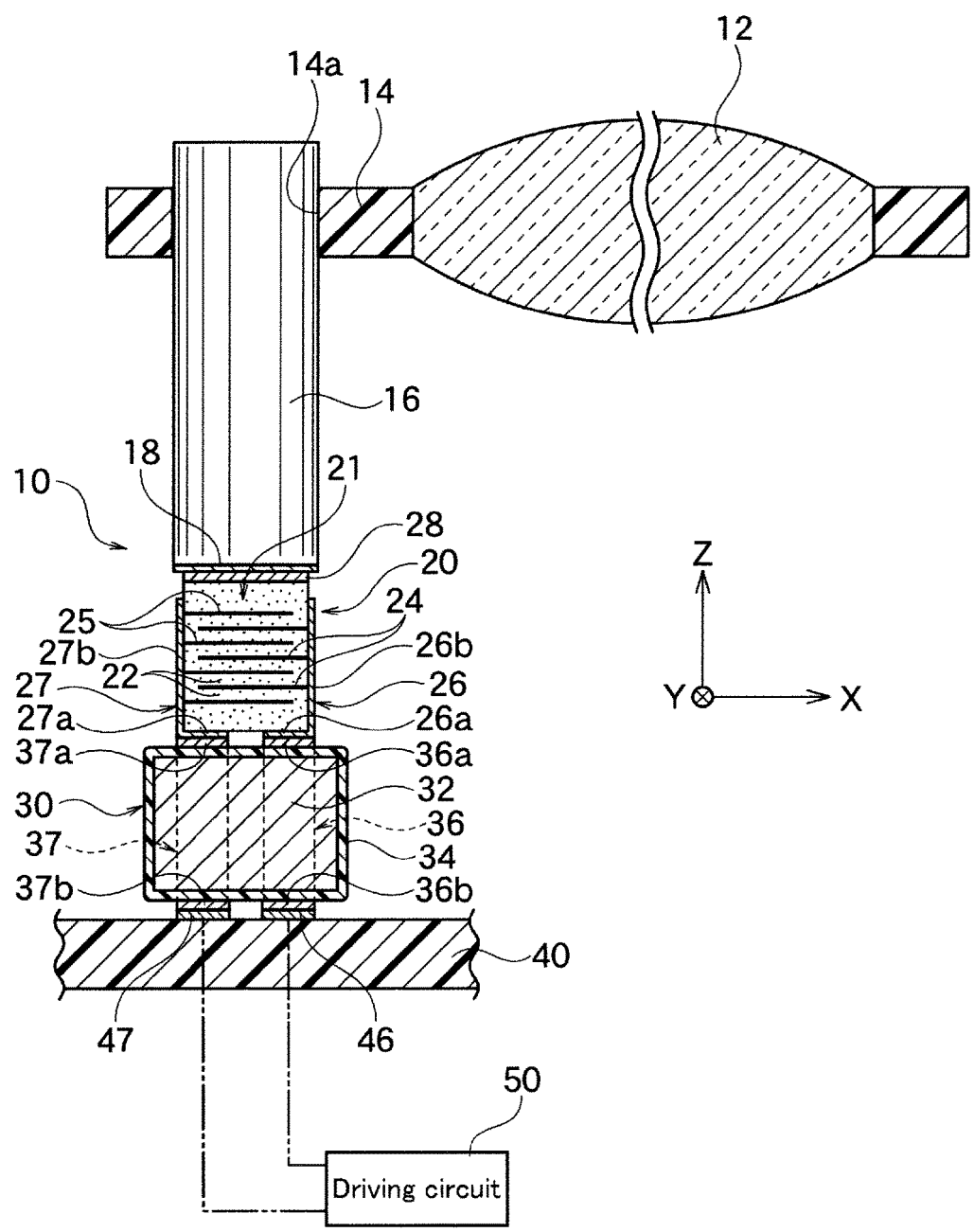
FIG. 1 is the schematic cross section of the lens driving device according to one embodiment of the present invention.

As shown in FIG. 1, the piezoelectric driving device 10 according to the first embodiment of the present invention is the lens driving device which moves the lens frame 14 (movable body) holding the lens 12 to a camera or so along the axial direction (Z axis direction) of the shaft 16. The lens frame 14 is engaged at the predetermined position of the axial direction of the shaft 16 by a friction, and the lens frame 14 is fitted in a movable manner along the axial direction.

The multilayered piezoelectric element 20 extends and vibrates in Z axis direction thereby the shaft 16 vibrates; and due to such vibration, the lens frame 14 moves against the shaft 16 in one or other Z axis direction. The shape of the voltage waveform and the time of application determine which way and to what degree the multilayered piezoelectric element 20 will move.

The piezoelectric driving device 10 comprises the shaft 16, the multilayered piezoelectric element 20, and the weight member 30. The shaft 16 generally has a cylinder shape, and for example it is constituted by a carbon-reinforced plastic, a steel material such as stainless steel, and a non-iron metal such as aluminum or so. The shaft 16 is engaged by inserting to the through hole 14a which is formed at the lens frame 14, and the shaft 16 holds the lens frame 14 in a movable manner along Z axis direction.

The multilayered piezoelectric element 20 comprises the element main body 21 of which the outer shape is approximately a polygonal pillar shape (a square pillar shape in the present embodiment), the first external electrode 26 and the second external electrode 27. At the inside of the element body 21, the first and the second internal electrodes 24 and 25 are stacked in alternating manner while placing the piezoelectric layer 22 in between. The part of the piezoelectric layer 26 where the first internal electrode 24 and the second internal electrode 25b are stacked in alternating manner will be the active part capable being modified by extending and shrinking in Z axis direction. The part at the both ends of Z axis direction of these stacked layers which is only constituted from the piezoelectric layer will be the non-active part. Note that, the outer shape of the element body 21 is not limited to the polygonal columnar shape, and it may be other shapes such as cylindrical columnar shape, oval columnar shape or so.

The first external electrode 26 formed at the outer face of the element main body 21 is formed from the first external connection part 26a and the first side face electrode part 26b; and these are formed as one body. Also, the second external electrode 27, which is formed at the outer face of the element main body 21 but insulated from the first external electrode 26, is formed from the second external connection part 27a and the second side face electrode part 27b; and these are formed as one body.

The first side face electrode part 26b is formed at one of the pair of the side faces facing in X axis direction of the element main body 21, and it is only connected to the first internal electrode 24 of the element body 21 but not connected to the second internal electrode 25. The first side face electrode 26b extends to the lower end along Z axis direction at the side face of the element main body 21, and it is continuously connected to the first external connection part 26a formed at the lower end face (the first end face) of the element main body 21 in Z axis direction.

The second side face electrode part 27b is formed at other side of the pair of side faces facing in X axis direction of the element main body 21, and it is only connected to the second internal electrode 25 of the element body 21 but not connected to the first internal electrode 24. The second side face electrode 27b extends to the lower end along Z axis direction at the side face of the element main body 21, and it is continuously connected to the second external connection part 27a formed at the lower end face (the first end face) of the element main body 21 in Z axis direction. At the lower end face of Z axis direction of the element main body 21, the first external connection part 26a and the second external part connection part 27a are insulated by separating apart in X axis direction.

In the present embodiment, at a pair of the side faces facing in Y axis direction of the element main body 21, the external electrodes 26 and 27 are not formed, however if the external electrodes 26 and 27 are securely insulated against each other, then these may be continuously formed at said side faces as well. Note that, in the figures, X axis, Y axis and Z axis are perpendicular against each other respectively, and Z axis matches with the stacking direction of the internal electrodes 24 and 25, and also matches with the axis direction of the shaft 16.

In the present embodiment, at the upper face (the second end face) in Z axis direction of the element main body 21, the dummy electrode 28 is formed. The dummy electrode 28 can be formed at the outer face of the element main body 21 as similar to the external electrodes 26 and 27; and it is constituted from the same material as the external electrodes 26 and 27, but insulated from the external electrodes 26 and 27. Also, among the side faces of the element main body 21 shown in FIG. 2, the resin layer for preventing the migration may be formed at the side faces (the sides faces facing in Y axis direction) where the external electrodes 26 and 27 are not formed. The resin layer may be formed so that it covers the side face electrode parts 26b and/or 27b.

As the conductive material constituting the first internal electrode 24 and the second internal electrode 25, for example precious metals such as Ag, Pd, Au, and Pt or so and the alloy thereof (Ag—Pd or so), and base metals such as Cu and Ni or so and the alloy thereof or so may be mentioned, however it is not limited thereto.

The conductive material constituting the first external electrode 26 and the second external electrode 27 are not particularly limited, and the same conductive material constituting the internal electrode can be used. Note that, the first external electrode 26 and the second external electrode 27 are formed at the outer face of the element main body 21 for example by printing the conductive paste; and on the surface thereof, a plating layer or sputter layer of above mentioned metals may be formed. The same applies to the dummy electrode 28. The thickness of the external electrodes 26 and 27 and the dummy electrode 28 are not particularly limited, but preferably it is 0.5 to 50 μm.

Also, the material of the piezoelectric layer 22 is not particularly limited as long as it is a material exhibiting piezoelectric effect or the inverse piezoelectric effect; and for example $PbZr_xTi_{1-x}O_3$, $BaTiO_3$ or so may be mentioned. Also, the component for improving the characteristics or so may be included, and the content thereof may be determined appropriately depending on the desired characteristic.

Figure 2:
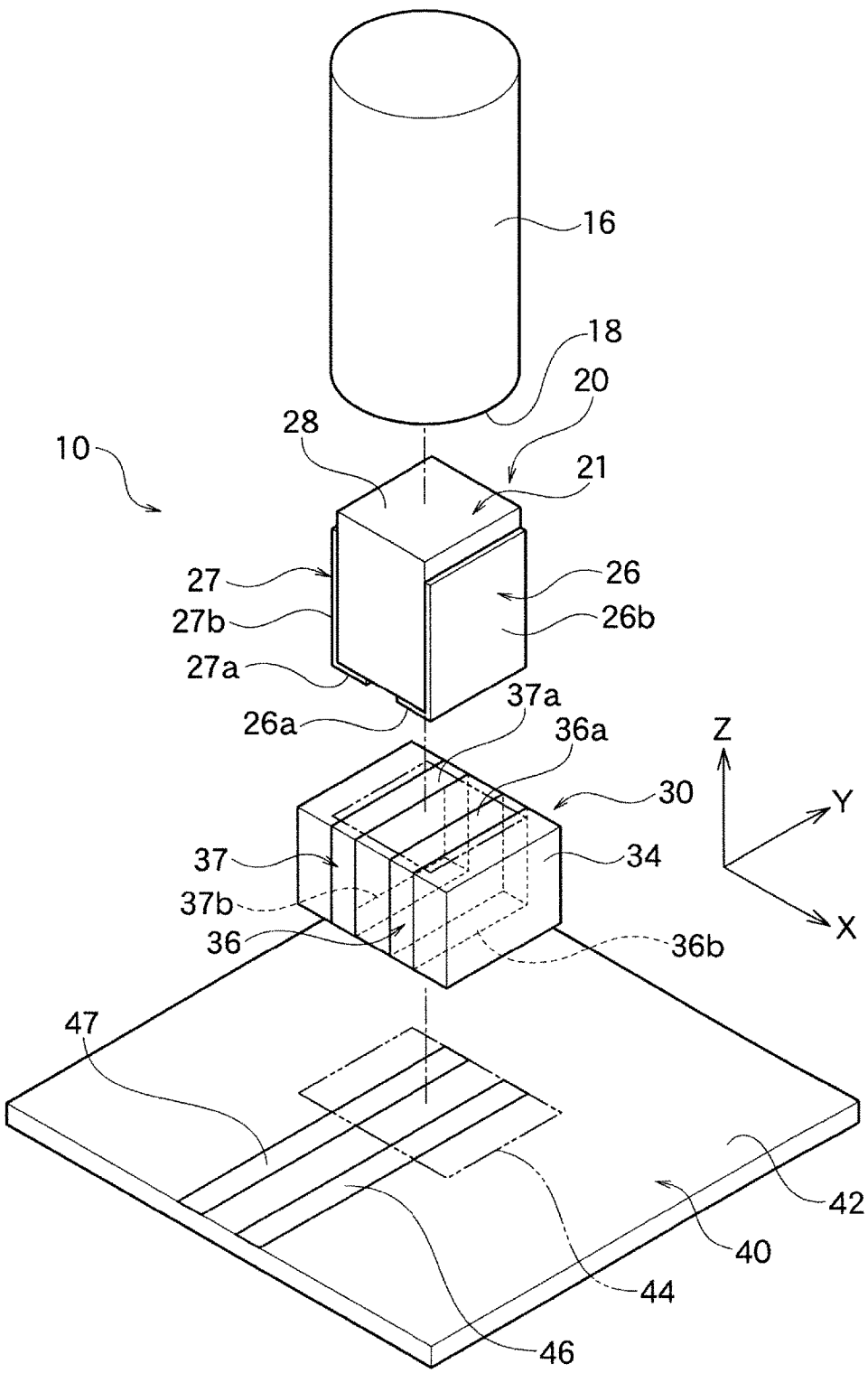
FIG. 2 is the exploded perspective view of the lens driving device shown in FIG. 1.

As shown in FIG. 2, in the piezoelectric driving device 10, the upper face of the weight member 30 in Z axis direction is arranged so to face against the lower end face of the element main body 21 in Z axis direction. The weight member 30 has a rectangular parallelepiped shape as a whole, and as shown in FIG. 1, the weight main body 32 is comprised inside thereof. Note that, the shape of the weight member 30 as a whole is not limited to a rectangular parallelepiped shape.

The weight main body 32 preferably includes a metal material having relatively large specific gravity such as tungsten and the like so that the weight main body 32 suitably functions as an inertial body for giving a displacement to the shaft 16, however it is not limited to tungsten and for example the weight main body 32 may be constituted from a conductive material such as iron, steel material, precious metal and aluminum or so. In case the weight main body 32 is constituted by a metal, the outer surface of the weight main body 32 is covered with an insulation layer 34.

As the insulation layer 34, for example it is constituted by a non-conductive plastic such as epoxy, acryl, polyimide, parylene or so, an oxide film, black chromate, DLC or so; and it is formed on the outer surface of the weight main body 32 by methods such as a coating, a printing, a vapor deposition, a heat treatment, a plating, and an adhesion or so. Note that, in case the weight main body 32 is constituted by the insulation material such as plastic or ceramic, then the insulation layer 34 does not need to be formed on the outer surface of the weight main body 32.

In the present embodiment, at the surface of the insulation layer 34, the first circuit pattern 36 and the second circuit pattern 37 which are insulated against each other are formed. These circuit patterns 36 and 37 can be formed on the surface of the weight member 30 for example as same as the external electrodes 26 and 27, and also these may be formed by the same material as the external electrodes 26 and 27. The thickness of the external electrodes 26 and 27 are preferably 0.5 to 50 µm.

These circuit patterns 36 and 37 respectively comprises the first opposing pattern 36a and the second opposing pattern 37a formed at the upper face (the opposing face against the multilayered piezoelectric element 20) of the weight member 30 in Z axis direction. The first opposing pattern 36a is connected to the first external connection part 26a by a metal bonding, and the second opposing pattern 37a is connected to the second external connection part 27a by a metal bonding. As the method for carrying out the metal bonding, it is not particularly limited; however a solid phase bonding methods such as an ultrasonic bonding, a solid phase diffusion bonding, a friction bonding or so, and a weld bonding by laser and a pulse heat or so can be used.

These circuit patterns 36 and 37 not only comprises the first opposing pattern 36a and the second opposing pattern 37a, but are also continuously formed to the lower face of the weight member in Z axis direction which is the fitting face to the surface 42 of the frame 40 where the weight member 30 is fitted. That is, the circuit patterns 36 and 37 respectively comprises the first fitting pattern 36b and the second fitting pattern 37b formed at the lower face in Z axis direction of the weight member 30.

The first opposing pattern 36a and the first fitting pattern 36b are part of the first circuit pattern 36, and these are electrically connected by the circuit pattern formed at the side face of the weight member 30. The second opposing pattern 37a and the second fitting pattern 37b are part of the second circuit pattern 37, and these are electrically connected by the circuit pattern formed at the side face of the weight member 30.

The first fitting pattern 36b is connected by a metal bonding to a first frame side circuit pattern 46 positioned at a weight fitting part 44 formed at the surface 42 of the frame 40. Also, the second fitting pattern 37b is connected by a metal bonding to a second frame side circuit pattern 47 positioned at the weight fitting part 44 formed at the surface 42 of the frame 40. The metal bonding is carried out as already discussed in above.

The frame 40 may be for example a fixing member to which the case surrounding the lens holding frame 14 shown in FIG. 1 is fitted; and the circuit patterns 46 and 47 are formed at the surface 42. As shown in FIG. 1, at the circuit patterns 46 and 47, the driving circuit 50 is connected.

The driving circuit 50 is a circuit for applying a driving voltage to the multilayered piezoelectric element 20. The driving circuit 50 may be fitted to the frame 40, or it may be provided separately from the frame 40. The method for forming the circuit patterns 46 and 47 to the frame 40 is not particularly limited, and for example the general method for forming the circuit pattern to a circuit substrate may be used.

The voltage waveform outputted from the driving circuit 50 is not particularly limited, however for example by outputting the voltage waveform of a sawtooth wave from the driving circuit 50, the moving amount exceeding the modification amount of the multilayered piezoelectric element 20 and the displacement amount of the shaft 16 can be generated to the lens frame 14 as the movable member.

In the present embodiment, as shown in FIG. 1, the bonding between the multilayered piezoelectric element 20 and the shaft 16 is carried out by a metal bonding between the metal face 18 formed at the lower face of the shaft 16 in Z axis direction and the dummy electrode 28 formed at the upper face of the multilayered element 20 in the Z axis direction. The metal bonding is carried out by the method described in the above. The metal bonding of each part may be done separately, or it may be carried out simultaneously. Note that, in case the shaft 16 is constituted by a metal, the metal face 18 is the lower face itself of the shaft 16 in Z axis direction; and in case it is constituted by material other than metal, the metal film is formed so that the metal face 18 is formed at the lower face of the shaft 16 in Z axis direction.

In the piezoelectric driving device 10 according to the present embodiment, the lead wire and the metal terminal are not connected to the multilayered piezoelectric element 20 via the solder or so. The electric power supply to the multilayered piezoelectric element 20 is done by a metal bonding between the first external connection part 26 of the multilayered piezoelectric element 20 and the circuit pattern 36 of the weight member 30, and by a metal bonding between the second external connection part 27 of the multilayered piezoelectric element 20 and the circuit pattern 37 of the weight member 30. The electrical power supply to these circuit patterns 36 and 37 are done through the frame side circuit patterns 46 and 47 from the driving circuit 50 shown in FIG. 1.

Therefore, the strong connection between the multilayered piezoelectric element 20 and the weight member 30, and the electrical connection wiring to the multilayered piezoelectric element 20 can be secured at the same time. Therefore, even if the multilayered piezoelectric element 20 is made compact, the multilayered piezoelectric element 20 and the weight member 30 can be connected easily, and also the wiring for the electrical power supply to the multilayered piezoelectric element 20 can be done easily. Also, these can be easily automated.

Further, the wiring is done by connecting the multilayered piezoelectric element 20 and the weight member 30, and the wire member such as the lead wire and the metal terminal or so are not connected apart from the weight member to the multilayered piezoelectric element 20, hence no sudden force will act on the wire member, thus no disconnection will occur between the wire member and the connection part.

Furthermore, the multilayered piezoelectric element 20 and the weight member 30 are connected by a metal bonding, thus the bonding strength thereof is enhanced. Also, compared to the case of connecting the multilayered piezoelectric element 20 and the weight member 30 by an adhesive agent, the displacement is not absorbed at the adhesive agent part, and the displacement force of the multilayered piezoelectric element 20 is directly transmitted to the weight member 30, hence the driving force is improved (little loss of the displacement).

Also, in the present embodiment, the weight main body 32 of the weight member 30 is constituted by a metal, and the insulation layer 34 is formed at the surface of the weight main body 32. At the surface of the insulation layer, the first circuit pattern 36 and the second circuit pattern 37 are formed. By constituting the weight main body 32 by a metal, the density of the weight member 30 increases, and contributes to make the piezoelectric driving device 10 compact. Note that, in case of constituting the weight main body 32 by a metal, the insulation may become an issue, however by covering the surface of the weight main body 32 with the insulation layer 34, the circuit patterns 36 and 37 are insulated against each other.

Also, at the upper end face of the element main body 21 in Z axis direction, the dummy electrode 28 is formed which is insulated from the external electrodes 26 and 27; and the metal face 18 of the shaft 16 facing the dummy electrode 28 is connected with the dummy electrode 28 by a metal bonding, and the shaft 16 and the multilayered piezoelectric element 20 are connected. By constituting as such, the multilayered piezoelectric element 20 and the shaft 16 are firmly connected, and also the process for connecting may be easily automated.

Further, in the present embodiment, as shown in FIG. 2, the first circuit pattern 36 and the second circuit pattern 37 are not only formed at the opposing face against the weight member 30 of the multilayered piezoelectric element, but also continuously formed to the fitting face to the surface of the frame 40 where the weight member 30 is fitted. At the surface of the frame, the frame side circuit patterns 46 and 47 are formed where the first circuit pattern 36 and the second circuit pattern 37 are connected.

By constituting as such, the weight member 30 can be connected to the frame 40, and at the same time the electrical connection between the circuit patterns 46 and 47 formed at the frame 40 and the circuit patterns 36 and 37 of the weight member 30 can be formed.

Note that, in the first embodiment discussed in the above, the multilayered piezoelectric element 20 and the weight member 30 only needs to be connected by a metal bonding, and other parts may be connected by methods other than metal bonding. For example, the shaft 16 and the multilayered piezoelectric element 20 can be connected by other method than metal bonding, such as a solder bonding or adhesion or so. Also, the connection between the weight member 30 and the frame may be connected by methods other than metal bonding, such as a solder bonding or adhesion or so.

Second Embodiment

Figure 3:
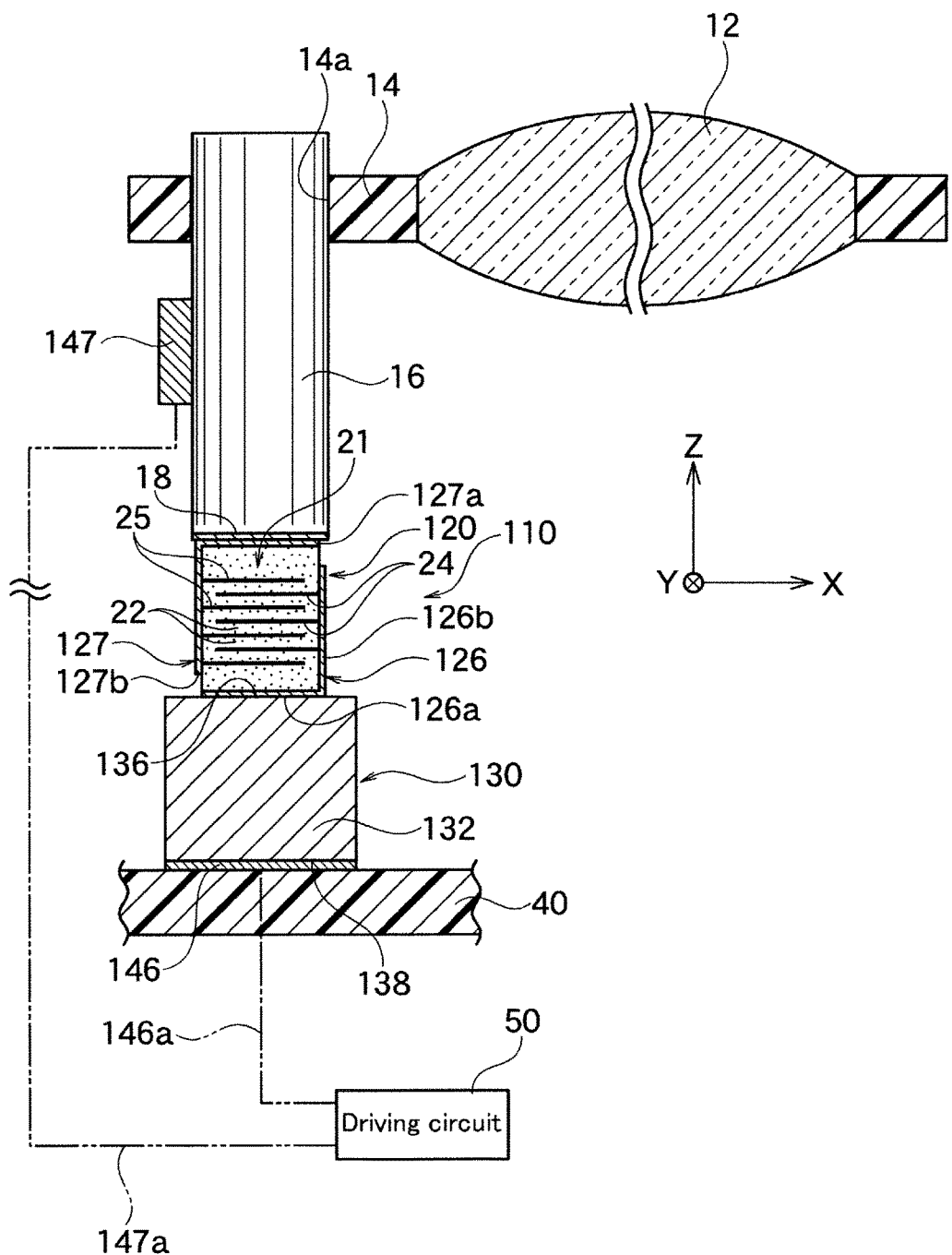
FIG. 3 is the schematic cross section view of the lens driving device according to other embodiment of the present invention.

As shown in FIG. 3, the piezoelectric driving device 110 according to the second embodiment of the present invention is a modified example of the above mentioned first embodiment, thus the same numerical references are given to the common parts. Also, the description which is same as the first embodiment will be omitted.

The piezoelectric driving device 110 comprises a shaft 16, a multilayered piezoelectric element 120 and the weight member 130. The shaft 16 generally has the cylinder shape, and for example it is constituted by a carbon-reinforced plastic, a steel material such as stainless steel, and a non-iron metal such as aluminum or so. The shaft 16 is engaged by inserting to the through hole 14a which is formed at the lens frame 14, and the shaft 16 holds the lens frame 14 in a movable manner along Z axis direction.

The multilayered piezoelectric element 120 comprises the element main body 21 of which the outer shape is approximately a polygonal pillar shape (a square pillar shape in the present embodiment), the first external electrode 126 and the second external electrode 127. In the inside of the element body 21, the first and the second internal electrodes 24 and 25 are stacked in alternating manner while placing the piezoelectric layer 22 in between. The part of the piezoelectric layer 126 where the first internal electrode 24 and the second internal electrode 25b are stacked in alternating manner will be the active part capable being modified by extending and shrinking in Z axis direction. The part at the both ends of Z axis direction of these stacked layers which is only constituted from the piezoelectric layer will be the non-active part. Note that, the outer shape of the element body 21 is not limited to the polygonal columnar shape, and it may be other shapes such as cylindrical columnar shape, oval columnar shape or so.

The first external electrode 126 formed at the outer face of the element main body 21 is formed from the first external connection part 126a and the first side face electrode part 126b; and these are formed as one body. Also, the second external electrode 127 formed at the outer face of the element main body 21 but insulated from the first external electrode 126 is formed from the second external connection part 127a and the second side face electrode part 127b; and these are formed as one body.

The first side face electrode part 126b is formed at one of a pair of the side faces facing in X axis direction of the element main body 21, and it is only connected to the first internal electrode 24 of the element body 21 but not connected to the second internal electrode 25. The first side face electrode 126b extends to the lower end along Z axis direction at the side face of the element main body 21, and it is continuously connected to the first external connection part 126a formed at the lower end face (the first end face) of the element main body 21 in Z axis direction.

The second side face electrode part 127b is formed at other side of a pair of side faces facing in X axis direction of the element main body 21, and it is only connected to the second internal electrode 25 of the element body 21 but not connected to the first internal electrode 24. The second side face electrode 127b extends to the upper end along Z axis direction at the side face of the element main body 21, and it is continuously connected to the second external connection part 127a formed at the upper end face (the second end face) of the element main body 21 in Z axis direction. The first external connection part 126a and the second external part connection part 127a are formed by facing each other at the both ends in Z axis direction of the multilayered piezoelectric element 120.

Figure 4:
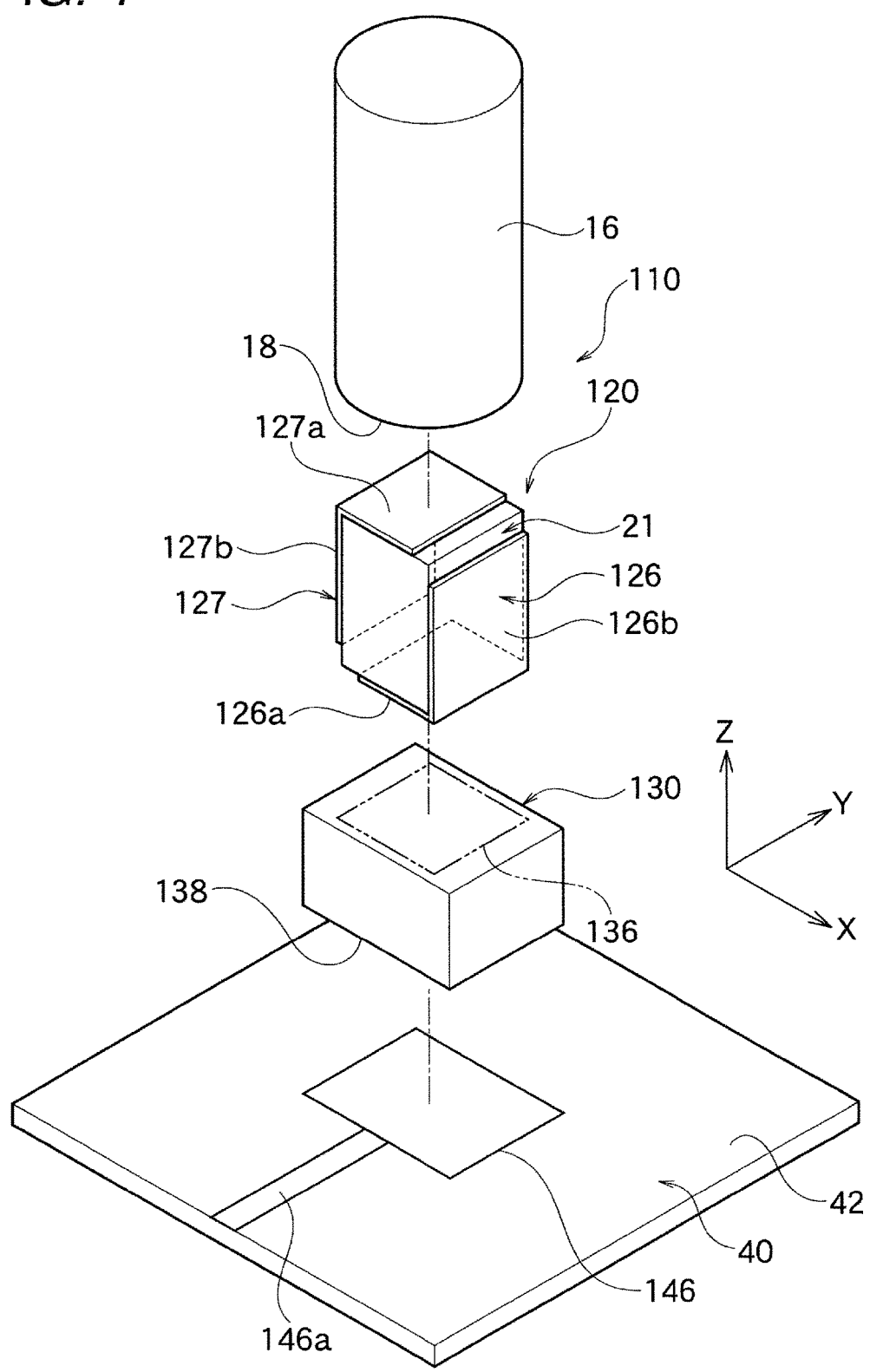
FIG. 4 is the exploded perspective view of the lens driving device shown in FIG. 3.

As shown in FIG. 4, in the present embodiment, at a pair of the side faces facing in Y axis direction of the element main body 21, the external electrodes 126 and 127 are not formed, however if the external electrodes 126 and 127 are securely insulated against each other, then these may be continuously formed at said side faces as well. Note that, in the figures, X axis, Y axis and Z axis are perpendicular against each other respectively, and Z axis matches with the stacking direction of the internal electrodes 24 and 25, and also matches with the axis direction of the shaft 16.

Among the side faces of the element main body 21 shown in FIG. 4, the resin layer for preventing the migration may be formed at the side faces (the sides faces facing in Y axis direction) where the external electrodes 126 and 127 are not formed. The resin layer may be formed so that it covers the side face electrode parts 126*b* and/or 127*b*.

The conductive material constituting the first external electrode 126 and the second external electrode 127 are not particularly limited, and the same conductive material constituting the internal electrode can be used. Note that, the first external electrode 126 and the second external electrode 127 are formed at the outer face of the element main body 21, for example by printing the conductive paste; and on the surface thereof, a plating layer or a sputter layer of above mentioned metals may be formed. The thickness of the external electrodes 126 and 127 are not particularly limited, but preferably it is 0.5 to 50 µm.

As shown in FIG. 4, in the piezoelectric driving device 110, the upper face of the weight member 130 in Z axis direction is arranged so to face against the lower end face of the element main body 21 in Z axis direction. The weight member 130 has a rectangular parallelepiped shape as a whole; however the shape thereof is not particularly limited.

The weight member 130 preferably includes a metal material having relatively large specific gravity such as tungsten and the like so that it suitably functions as an inertial body for giving a displacement to the shaft 16; however it is not particularly limited to tungsten or so and for example it may be constituted from iron, steel material, precious metal and aluminum or so. In case the weight main body 132 is constituted by a metal, the outer surface of the weight main body 132 is a metal face.

Particularly, to the opposing face of the weight member 130 corresponding to the lower face of the multilayered piezoelectric element 120 in Z axis direction, the weight side metal face 136 which is connected by a metal bonding to the first external connection part 126*a* is formed. Also, the lower face of the weight member 130 in Z axis is the metal face, and it is connected by a metal bonding to the frame side circuit pattern 146 formed at the surface 42 of the frame 40.

Note that, the weight member 130 may be constituted by an insulating material such as plastic and ceramic or so. In such case, the weight side metal face 136 connected by a metal bonding to the first external connection part 126*a* needs to be formed at the opposing face of the weight member 130 corresponding to the lower face of the multilayered piezoelectric element 120 in Z axis direction, and also the lower face of the weight member 130 in Z axis direction needs to be a metal face to electrically connect these. Thus, at the surface of the insulating weight member 130, the circuit pattern constituted by the metal film may be formed.

Also, in case the weight member 130 is constituted from the metal, the outer surface other than the weight side metal face 136 which is a metal face and the weight fitting face 138 which is a metal face may be covered with an insulation film.

In the present embodiment, the method for carrying out the metal bonding is not particularly limited; however a solid phase bonding method such as an ultrasonic bonding, a solid phase diffusion bonding, a friction bonding or so, and a weld bonding using a laser and a pulse heat or so can be used.

The frame 40 may be for example a fixing member to which the case surrounding the lens holding frame 14 shown in FIG. 3 is fitted. At the surface of the frame 40, the frame side circuit pattern 146 and a lead pattern 146*a* connected thereto as one body are formed. As shown in FIG. 3, the driving circuit 50 is connected to the lead pattern 146*a* of the frame side circuit pattern 146. The lead pattern 146*a* is connected to the driving circuit 50 shown in FIG. 3. These patterns 146 and 146*a* can be formed at the surface of the frame 42 constituted by an insulation material, by a printing method, a plating method and a sputter method or so of the metal paste.

In the present embodiment, as shown in FIG. 3, the bonding between the multilayered piezoelectric element 120 and the shaft 16 are done by a metal bonding of the shaft side metal face 18 formed at the lower face of the shaft 16 in Z axis direction, and the second external connection part 127*a* formed at the upper face of the multilayered element 120 in Z axis direction. The metal bonding is done by the method mentioned in the above. The metal bonding of each part may be done separately, or it may be carried out simultaneously. Note that, in case the shaft 16 is constituted by a metal, the shaft side metal face 18 is the lower face itself of the shaft 16 in Z axis direction; and in case it is constituted by material other than metal, the metal film is formed so that the metal face 18 is formed at the lower face of the shaft 16 in Z axis direction.

At the position where the movements of the lens frame 14 in Z axis direction is not intervened, the shaft pressor 147 is in contact with the shaft 16 in the middle of Z axis direction of the shaft 16. The shaft pressor 147 has the function to support the shaft 16 and to determine the position of the shaft 16, and it is generally installed in the lens driving device. In the present embodiment, the shaft pressor 147 itself is constituted by a conductive material, or the shaft pressor 147 itself is constituted by an insulation material; and the contact part between the shaft 16 is provided with the circuit pattern or the conductive member so that the conductive pathways is formed.

In case the shaft pressor 147 is constituted by a conductive material, for example the wire 147*a* is connected to the shaft pressor 147. The wire 147*a* is connected to the driving circuit 50. At least a part of the wire 147*a* may constitute the lead wire, and for example it is preferably constituted by the circuit pattern formed at the surface of the frame 40. In case the shaft pressor 147 is constituted by the insulating member, the wire 147*a* is connected to the circuit pattern formed at the surface of the shaft pressor 147. The circuit pattern formed at the surface of the shaft pressor 147 is electrically connected to the surface of the shaft 16.

If the shaft 16 is constituted by a conductive material, one of the voltage from the driving circuit 50 is transmitted to the shaft pressor 147 itself or to the circuit pattern thereof via the wire 147*a*; and therefrom it is transmitted to the second external electrode 127 through the shaft 16 and the metal face 18. In case the shaft 16 is constituted by an insulation member, the voltage is transmitted to the second external electrode 127 through the metal face 18 and the circuit pattern formed at the surface of the shaft 16. Other voltage from the driving circuit 50 is transmitted to the first external electrode 126 through the lead pattern 146*a*, the frame side circuit pattern 146 and the weight member 130.

The driving circuit 50 is the circuit for applying the driving voltage to the multilayered piezoelectric element 120. The driving circuit 50 may be fitted to the frame 40, or it may be provided apart from the frame 40. The method for forming the patterns 146, 146a, or other circuit patterns to the frame 40 is not particularly limited, and for example a method for forming the circuit pattern to a general circuit substrate may be used.

The voltage waveform outputted from the driving circuit 50 is not particularly limited, however by for example outputting the voltage waveform of a sawtooth wave from the driving circuit 50, the moving amount exceeding the modification amount of the multilayered piezoelectric layer 120 and the displacement amount of the shaft 16 can be generated to the lens frame 14 as the movable member.

In the piezoelectric driving device 110 according to the present embodiment, the lead wire and the metal terminal are not connected to the multilayered piezoelectric element 120 via the solder or so. The electric power supply to the multilayered piezoelectric element 120 is done by a metal bonding between the weight side metal face 136 and the first external connection part 126, and by a metal bonding between the shaft side metal face 18 and the second external connection part 127. These parts where the metal bonding are carried out are the parts where the reverse-voltage is applied for driving the multilayered piezoelectric element 120, also at the same time, these parts function as the connection of the multilayered piezoelectric element 120 and the weight member 130, and also as the connection of the multilayered piezoelectric element 120 and the shaft 16.

Therefore, a strong connection between the multilayered piezoelectric element 120 and the weight member 130, a strong connection between the multilayered piezoelectric element 120 and the shaft 16, and the wiring for the electrical connection to the multilayered piezoelectric element 120 can be secured all at the same time. Therefore, even if the multilayered piezoelectric element 120 is made compact, the multilayered piezoelectric element 120 and the weight member 130 can be easily connected, and the multilayered piezoelectric element 120 and the shaft 16 can be easily connected, and the wiring for supplying the electrical power to the multilayered piezoelectric element 120 can be easily done. Also, these can be easily automated.

Further, the wire member such as the lead wire and the metal terminal or so are not connected apart from the weight member to the multilayered piezoelectric element 120, hence no sudden force will act on the wire member, and thus no disconnection will occur between the wire member and the connection part. Also, at least part of the shaft 16 (or it may be the entire shaft 16), and at least part of the weight member 130 (or it may be the entire shaft 130) function as the wiring, thus the number of the parts can be reduced.

Furthermore, the multilayered piezoelectric element 120 and the weight member 130 are connected by a metal bonding, and also the multilayered piezoelectric element 120 and the shaft 16 are connected by a metal bonding, therefore the bonding strength thereof are enhanced. Also, compared to the case of connecting these by an adhesive agent, the displacement is not absorbed at the adhesive agent part, and the displacement force of the multilayered piezoelectric element 120 is directly transmitted to the weight member 130, and the shaft 16 hence the driving force improves (little loss of the displacement).

Also, in the present embodiment, by constituting the weight member 130 by a metal, the density of the weight member 130 increases, and contributes to make the piezoelectric driving device 110 compact. Also, by constituting the weight member 130 by a metal, the outer surface of the weight member 130 will constitute the weight side metal face itself; hence there is no need to form the metal face apart from the weight member 130. Note that, in case the weight member 130 is constituted by a material other than metal, the weight side metal face for the metal bonding of the multilayered piezoelectric element may be formed by the circuit pattern such as metal film or so.

Also, the shaft pressor 147 is in contact with the shaft 16, and the electric power can be supplied to the shaft side metal face through the shaft 16 and the shaft pressor 147. For example, in the lens driving device, the shaft pressor is an essential component, and it allows providing the electric power to the multilayered piezoelectric element 120 via the shaft side metal face 18 without increasing the number of the parts.

Further, in the present embodiment, in case the shaft 16 is a metal, the shaft side metal face 18 can be easily formed using the outer surface of the shaft 16. In such case, the shaft 16 is the electric conductive pathway. In case the shaft 16 is a conductive material other than metal, the same applies. Note that, in order to form the metal face 18, the circuit pattern may be formed by a metal film or so at the predetermined position of the shaft 16. This is the same in case the shaft 16 is the insulator.

Also, in the present embodiment, the weight member 130 is connected to the frame 40, and also at the same time the circuit pattern 146 formed at the frame 40 can be electrically connected to the weight member 130. These connections can also be done by a metal bonding.

Note that, in the second embodiment discussed in above, the multilayered piezoelectric element 120 and the weight member 130 are connected by a metal bonding, and also the multilayered piezoelectric element 120 and the shaft 16 are connected by a metal bonding; and for other parts it may be connected by methods other than a metal bonding. For example, the weight member 130 and the frame 40 may be bonded by the method other than metal bonding for example such as by a solder bonding or by adhesion (including conductive adhesive agent).

The present invention is not to be limited to the above mentioned first and the second embodiment, and it can be modified variously within the scope of the present invention.

For example, in the above mentioned two embodiments, as the method for the metal bonding, the ultrasonic bonding is used; however other methods may be used as well. As other method for carrying out the metal bonding, for example, a diffusion bonding, a friction bonding, a laser, and a pulse heat or so may be mentioned.

Also, in the above mentioned two embodiments, as the piezoelectric driving device 10 (or 110), the driving device for moving the lens frame 14 holding the lens 12 along the shaft is shown as an example, however the movable body may be other member than the lens frame. As the movable body, for example a plate spring so called a slider may be mentioned as an example.

The invention claimed is:
1. A piezoelectric driving device comprising
a multilayered piezoelectric element comprising internal electrodes stacked by placing a piezoelectric layer in between, and a pair of external electrodes electrically connected to said internal electrodes,
a weight member fitted to one of a first end face in said stacking direction of said multilayered piezoelectric element,
a shaft fitted to other second end face in said stacking direction of said multilayered piezoelectric element, and a movable member engaged against said shaft in a movable manner in an axial direction which moves by driving said multilayered piezoelectric element, wherein a pair of said external electrodes comprises a first external connection part and a second external connection part which are respectively formed at said first end face and so that said first external connection part and said second external connection part are insulated against each other, a first circuit pattern and a second circuit pattern which are insulated against each other are formed at an opposing face of said weight member facing said first end face, and said first circuit pattern and said second circuit pattern are respectively connected to said first external connection part and said second external connection part by metal bonding.

2. The piezoelectric driving device as set forth in claim 1, wherein said weight member is constituted by a metal, an insulation layer is formed at a surface of said weight member, and said first circuit pattern and said second circuit pattern are formed at the surface of said insulation layer.

3. The piezoelectric driving device as set forth in claim 1, wherein a dummy electrode which is insulated from said external electrode is formed at said second end face, a metal face of said shaft facing said dummy electrode is connected with said dummy electrode by metal bonding, and said shaft and said multilayered piezoelectric element are connected.

4. The piezoelectric driving device as set forth in claim 2, wherein a dummy electrode which is insulated from said external electrode is formed at said second end face, a metal face of said shaft facing said dummy electrode is connected with said dummy electrode by metal bonding, and said shaft and said multilayered piezoelectric element are connected.

5. The piezoelectric driving device as set forth in claim 1, wherein said first circuit pattern and said second circuit pattern are not only formed at the opposing face of said weight member but also continuously formed to the fitting face to a surface of a frame where said weight member is fitted, and a frame side circuit pattern where said first circuit pattern and said second circuit pattern are connected is formed at the surface of said frame.

6. The piezoelectric driving device as set forth in claim 2, wherein said first circuit pattern and said second circuit pattern are not only formed at the opposing face of said weight member but also continuously formed to the fitting face to a surface of a frame where said weight member is fitted, and a frame side circuit pattern where said first circuit pattern and said second circuit pattern are connected is formed at the surface of said frame.

7. A piezoelectric driving device comprising a multilayered piezoelectric element comprising internal electrodes stacked by placing a piezoelectric layer in between, and a pair of first external electrode and second external electrode electrically connected to said internal electrodes, a weight member fitted to one of a first end face in said stacking direction of said multilayered piezoelectric element, a shaft fitted to other second end face in said stacking direction of said multilayered piezoelectric element, and a movable member engaged against said shaft in a movable manner in an axial direction which moves by driving said multilayered piezoelectric element, wherein said first external electrode comprises a first external connection part formed at said first end face, said second external electrode comprises a second external connection part formed at said second end face, a weight side metal face is formed at an opposing face of said weight member which is facing said first end face, and said weight side metal face is connected to said first external connection part by metal bonding, a shaft side metal face is formed at an opposing face of said shaft which is facing said second end face, and said shaft side metal face is connected to said second external connection part by metal bonding.

8. The piezoelectric driving device as set forth in claim 7 wherein said weight member is constituted by metal.

9. The piezoelectric driving device as set forth in claim 7 wherein a shaft pressor is in contact with said shaft, and an electric power can be supplied to said shaft side metal face via said shaft and said shaft pressor.

10. The piezoelectric driving device as set forth in claim 8 wherein a shaft pressor is in contact with said shaft, and an electric power can be supplied to said shaft side metal face via said shaft and said shaft pressor.

* * * * *